United States Patent
Morioka (10) Patent No.: US 11,187,741 B2
(45) Date of Patent: Nov. 30, 2021

(54) ELECTRICAL CHARACTERISTIC MEASURING DEVICE FOR SEMICONDUCTOR DEVICE

(71) Applicant: Mitsubishi Electric Corporation, Tokyo (JP)

(72) Inventor: Norifumi Morioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/975,970

(22) PCT Filed: May 28, 2018

(86) PCT No.: PCT/JP2018/020335
§ 371 (c)(1),
(2) Date: Aug. 26, 2020

(87) PCT Pub. No.: WO2019/229798
PCT Pub. Date: Dec. 5, 2019

(65) Prior Publication Data
US 2021/0041492 A1 Feb. 11, 2021

(51) Int. Cl.
*G01R 31/26* (2020.01)

(52) U.S. Cl.
CPC ................. *G01R 31/2601* (2013.01)

(58) Field of Classification Search
CPC ................................ G01R 31/2601
See application file for complete search history.

(56) References Cited

U.S. PATENT DOCUMENTS

2005/0135065 A1* 6/2005 Nakatsu .............. H01L 23/4006
361/703
2007/0159192 A1* 7/2007 Hasegawa .......... G01R 31/2889
324/750.19

FOREIGN PATENT DOCUMENTS

JP H03-74374 U 7/1991
JP H05-196686 A 8/1993
(Continued)

OTHER PUBLICATIONS

International Search Report issued in PCT/JP2018/020335; dated Jul. 17, 2018.
(Continued)

*Primary Examiner* — Clayton E. LaBalle
*Assistant Examiner* — Michael A Harrison
(74) *Attorney, Agent, or Firm* — Studebaker & Brackett PC (57) ABSTRACT

An electrical characteristic measuring device (70) comprises an evaluation table (30) on which a semiconductor device (10) is to be placed, and a device pressing member (20) to press the device (10). The pressing member (20) comprises a non-conductive electrode pressing part (22) to press a device electrode part (12) and a flange pressing part (23) to press a flange portion (14) of a base material (11). In a flange contact part (42) of the flange pressing part (23), a surface facing the flange portion (14) of the base material (11) has the same shape as a flange facing surface of a screw head of a screw (16) for fastening to an apparatus on which the device 10 is to be mounted. When the device (10) is pressed against the evaluation table (30) by the pressing member (20), the flange pressing part (23) is placed at a position of the base material (11) corresponding to a position of a fastening portion (17) in which a screw insertion groove (15)

(Continued)

is included and in which the screw (16) is fastened to base material (11).

15 Claims, 7 Drawing Sheets

(56) References Cited

FOREIGN PATENT DOCUMENTS

| | | |
|---|---|---|
| JP | H06003412 A | 1/1994 |
| JP | H06-118129 A | 4/1994 |
| JP | H09-329646 A | 12/1997 |
| JP | H11295384 A | 10/1999 |
| JP | 2012225815 A | 11/2012 |
| JP | 2014153293 A | 8/2014 |
| JP | 2016-031324 A | 3/2016 |

OTHER PUBLICATIONS

An Office Action; "Notice of Reasons for Refusal," mailed by the Japanese Patent Office dated Aug. 17, 2021, which corresponds to Japanese Patent Application No. 2020-521651 and is related to U.S. Appl. No. 16/975,970 with with English translation.

\* cited by examiner

ELECTRICAL CHARACTERISTIC MEASURING DEVICE FOR SEMICONDUCTOR DEVICE

TECHNICAL FIELD

The present application relates to an electrical characteristic measuring device used when electrical characteristics of a semiconductor device are measured.

BACKGROUND ART

A semiconductor device for processing a high frequency signal, such as amplifying a high frequency signal, is equipped with a high frequency semiconductor element such as a high electron mobility transistor (HEMT). Such a semiconductor device may, for example, include a base member to which the source of a high frequency semiconductor element is connected, and leads each connected to the gate and the drain thereof. In the above described semiconductor device, a groove for screw fastening is formed in the base member in order to fix the semiconductor device to be mounted to an apparatus using a screw. After the manufacture, electrical characteristics of the semiconductor device are measured and inspected to check whether the standard is satisfied. For the electrical characteristic measurement in the inspection, an electrical characteristic measuring device is used to supply a power supply voltage and an input signal to the semiconductor device, and to output an output signal from the semiconductor device to a measurement instrument (refer to, for example, Patent Document 1 and Patent Document 2).

In Patent Document 1, an inspection jig corresponding to an electrical characteristic measuring device is disclosed in which a main body (sealed body) and each of leads in the semiconductor element are configured to be pressed by their corresponding pressing pieces provided in a pressing member to fix the semiconductor element without using screws when the semiconductor element (semiconductor device) is fixed to a jig block (base). Further in Patent Document 2, a high frequency characteristic evaluation jig corresponding to an electrical characteristic measuring device is disclosed in which each of entire longitudinal ends of a base member and each of leads in a high frequency element are configured to be pressed by their corresponding projections provided in a pressing mechanism to fix the high frequency element without using screws when the high frequency element (semiconductor device) is fixed to a base.

CITATION LIST

Patent Document

Patent Document 1: Japanese Patent Application Laid-open No. H11-295384 (paragraph: 0014, FIG. 1)
Patent Document 2: Japanese Patent Application Laid-open No. 2012-225815 (paragraphs: 0011, 0021 to 0028, FIG. 1, FIG. 3)

SUMMARY OF INVENTION

Problems to be Solved by Invention

In the case of fixing the semiconductor device (semiconductor element) without using screws in the electrical characteristic measuring device (inspection jig) of Patent Document 1, since the top face of the semiconductor device (the top face of the sealed body) is pressed, the pressing force to fix the semiconductor device needs to be lowered, as compared to the screw fastening during mounting, in order to avoid deformation of the semiconductor device due to excessive pressing force. As a result, the physical contact between the back side of the semiconductor device and the base in the electrical characteristic measuring device of Patent Document 1 deteriorates, and a problem arises in that the heat dissipation and the electrical characteristics degrade during the measurement.

In addition, in the case of fixing the semiconductor device (high frequency element) without using screws in the electrical characteristic measuring device (high frequency characteristic evaluation jig) of Patent Document 2, since the entire longitudinal ends in the base member of the semiconductor device is pressed, the pressing force with the distribution different from that in the screw fastening during mounting is applied to the semiconductor device. In order to avoid the deformation and failure of the semiconductor device caused by the reason above, the pressing force needs to be reduced. Thus, the electrical characteristic measuring device of Patent Document 2 has the same problem as the electrical characteristic measuring device of Patent Document 1 in that the heat dissipation and the electrical characteristics degrade during the measurement.

The technique disclosed in the specification of the present application has been made in order to solve the above problems, and an object is to provide an electrical characteristic measuring device for a semiconductor device capable of increasing a pressing force as compared with a conventional technique.

Means for Solving Problems

An electrical characteristic measuring device for a semiconductor device disclosed in the present specification as an example is the electrical characteristic measuring device for the semiconductor device used when measuring electrical characteristics of the semiconductor device including a base member in which a plurality of screw insertion grooves are formed, and comprises: an evaluation table in which the semiconductor device is to be placed; and a device pressing member to press the semiconductor device against the evaluation table. The evaluation table comprises a conductive base in which the semiconductor device is to be placed and also a device placement portion to be connected to the base member of the semiconductor device is formed, and a plurality of evaluation boards in which strip conductors each to be connected to each of a plurality of device electrode parts of the semiconductor device is formed. The device pressing member comprises a plurality of non-conductive electrode pressing parts each to press each of the plurality of device electrode parts of the semiconductor device against each of the strip conductors of the evaluation table, and comprises a plurality of flange pressing parts in which conductive flange insertion parts each to be inserted into each of the plurality of screw insertion grooves formed in flange portions that are ends of the base member, and conductive flange contact parts fixed to the flange insertion parts, to press the flange portions of the base member against the base. The flange contact parts are such that flange facing surfaces thereof facing the flange portion of the base member have the same shape as flange facing surfaces of screw heads of recommended screws recommended when the semiconductor device is to be fastened to a mounting target apparatus in which the semiconductor device is to be mounted. When the semiconductor device is to be pressed against the evaluation table by the device pressing member, each of the flange pressing parts is placed at each of positions in the flange portions of the base member corresponding to each of positions of fastening portions in which the screw insertion grooves are included and in which the recommended screws are to be fastened to the flange portions of the base member, and each of the electrode pressing parts is placed at each of the device electrode parts.

Effect of Invention

An electrical characteristic measuring device for a semiconductor device disclosed in the present specification as an example comprises a device pressing member including electrode pressing parts to press device electrode parts and flange pressing parts to press flange portions of a base member, wherein flange facing surfaces of the flange pressing parts have the same shape as flange facing surfaces of screw heads of recommended screws, and the flange pressing parts are placed at positions corresponding to the positions of the fastening portions in which the recommended screws are fastened to the flange portions of the base member. Thus, the pressing force can be increased more than in the past when the electrical characteristics are measured.

MODES FOR CARRYING OUT INVENTION

Embodiment 1

Figure 1:
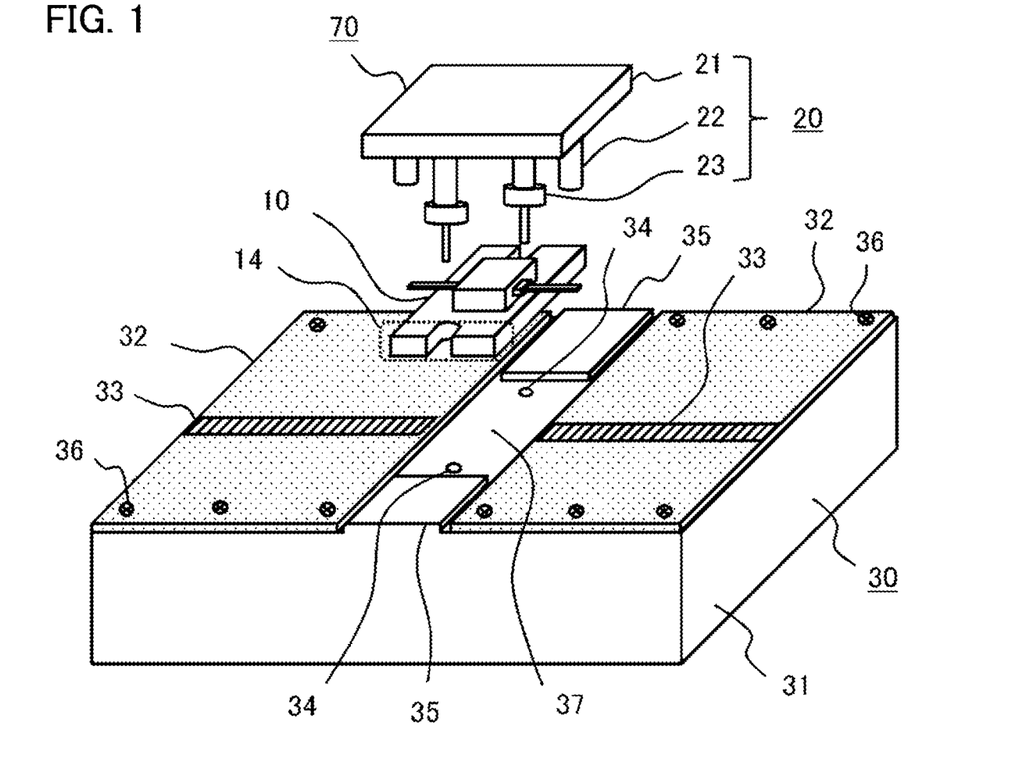
FIG. 1 is a perspective view of a first electrical characteristic measuring device according to Embodiment 1.
Figure 2:
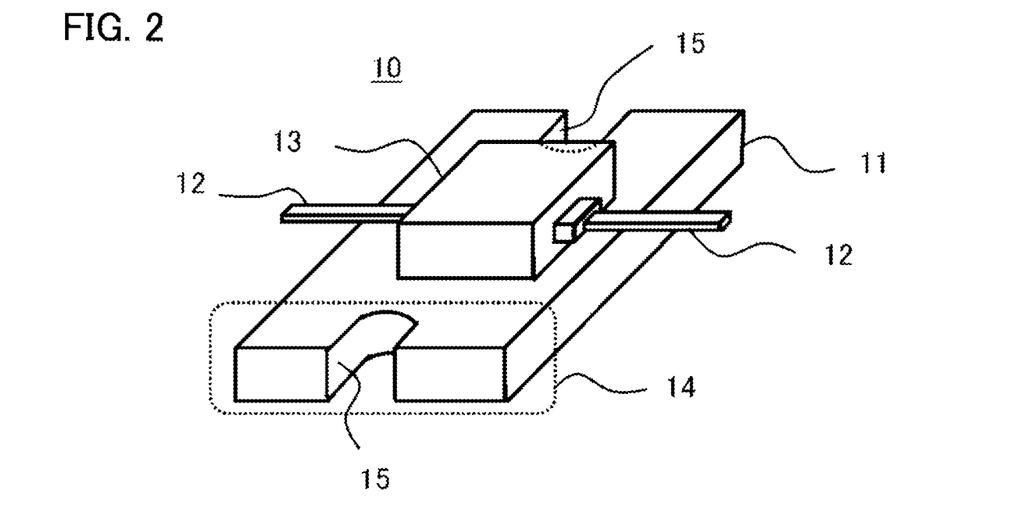
FIG. 2 is a perspective view of a semiconductor device of FIG. 1.
Figure 3:
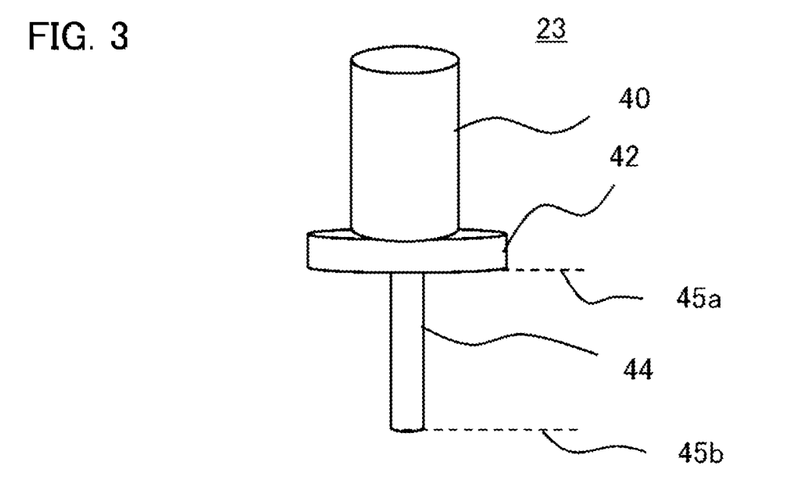
FIG. 3 is a diagram illustrating a flange pressing part of FIG. 1.
Figure 4:
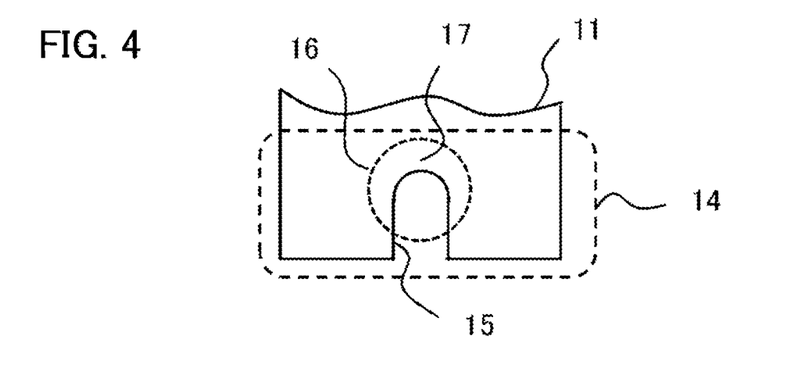
FIG. 4 is a diagram for describing a fastening portion of the semiconductor device when the device is to be fastened with screws to a mounting target apparatus.
Figure 5:
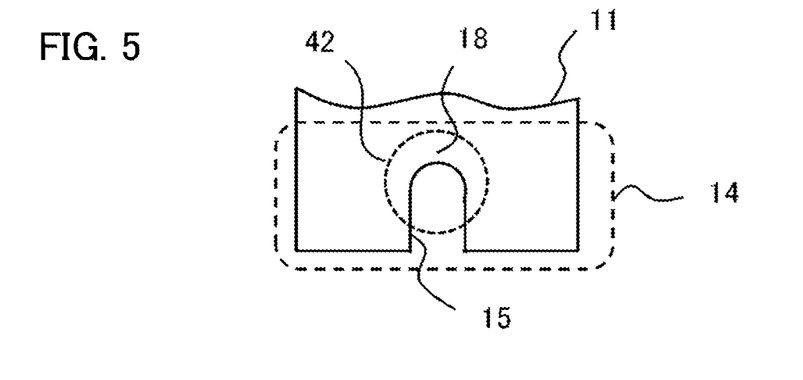
FIG. 5 is a diagram for describing a connecting portion of the semiconductor device when the device is pressed by the electrical characteristic measuring device.
Figure 6:
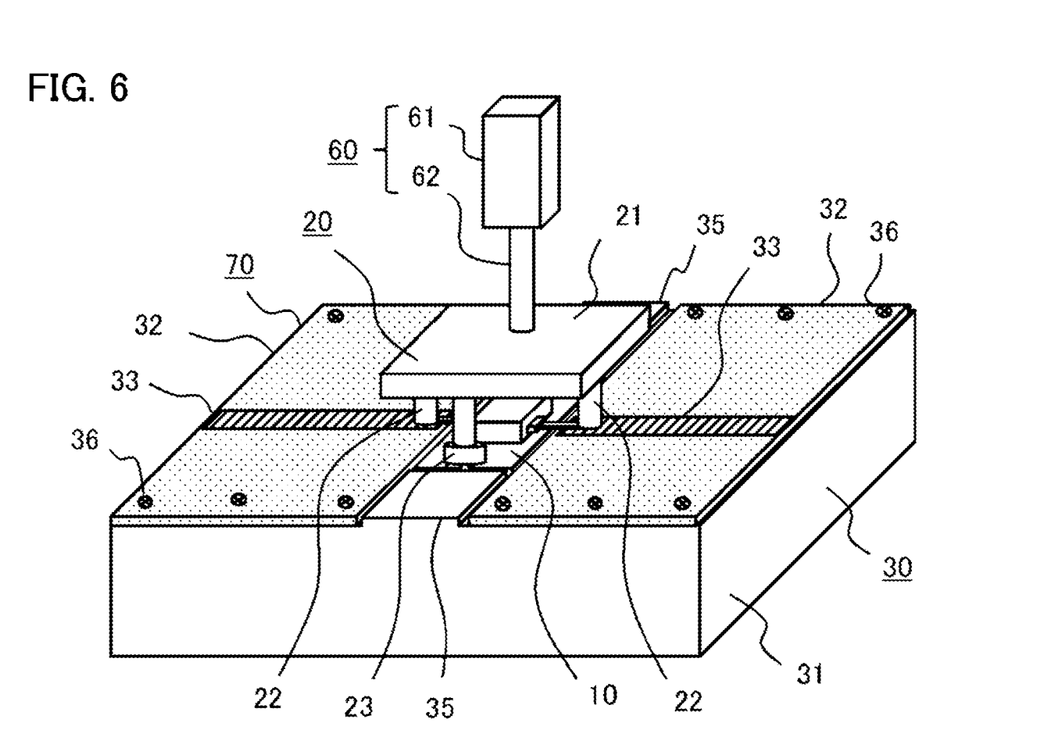
FIG. 6 is a perspective view of a first electrical characteristic measuring device and a first external pressing member according to Embodiment 1.

FIG. 1 is a perspective view of a first electrical characteristic measuring device according to Embodiment 1. FIG. 2 is a perspective view of a semiconductor device of FIG. 1. FIG. 3 is a diagram illustrating a flange pressing part of FIG. 1. FIG. 4 is a diagram for describing a fastening portion of the semiconductor device when the device is to be fastened with screws to a mounting target apparatus. FIG. 5 is a diagram for describing a connecting portion of the semiconductor device when the device is pressed by the electrical characteristic measuring device. FIG. 6 is a perspective view of the first electrical characteristic measuring device and a first external pressing member according to Embodiment 1. The electrical characteristic measuring device 70 according to Embodiment 1 comprises an evaluation table 30 on which the semiconductor device 10 is to be placed, and a device pressing member 20 that presses the semiconductor device 10. The electrical characteristic measuring device 70 is used when the electrical characteristics of the semiconductor device 10 are measured. First, the semiconductor device 10 that is a target for the measurement is described, and then the electrical characteristic measurement device 70 is described.

The semiconductor device 10 is equipped with, for example, a gallium nitride (GaN)-based high frequency semiconductor element (not shown). The semiconductor device 10 includes a base member 11, device electrode parts 12, and a sealed body 13 in which the high frequency semiconductor element is sealed. In FIGS. 1 and 2, the semiconductor device 10 including two device electrode parts 12 is shown. The source of the high frequency semiconductor element is connected to the base member 11, and the two device electrode parts 12 each are connected to the gate and the drain of the high frequency semiconductor element. Flange portions 14 that are ends of the base member 11 have screw insertion grooves 15 formed for inserting screws (fasteners) for fixing the semiconductor device 10 to an apparatus, namely, the mounting target apparatus in which the semiconductor device is to be mounted. As shown in FIG. 4, when the semiconductor device 10 is fixed to the mounting target apparatus, screws 16 are inserted into the screw insertion grooves 15 provided in the flange portions 14 of the base member 11, and the screws 16 are fastened such that screw head facing portions facing to screw heads in the flange portions 14 are pressed by the screw heads of the screws 16. The screw head facing portions are fastening portions 17 when the semiconductor device 10 is fastened with the screws to the mounting target apparatus. In FIG. 4, a screw head of the screw 16 is shown by the dashed line and the portion where the base member 11 and the screw head of the screw 16 shown by the dashed line overlap is a fastening portion 17. In FIGS. 1 and 2, the dashed line indicating a flange portion 14 is shown only on the near side in the paper, but the flange portion 14 having the screw insertion groove 15 formed is also present on the far side in the paper.

An evaluation table 30 of the electrical characteristic measuring device 70 includes a conductive base 31 and evaluation boards 32. In the evaluation boards 32, strip conductors 33 being conductive each corresponding to an input-side and an output-side of the device electrode parts 12 of the semiconductor device 10 are disposed. The strip conductors 33 are matched in characteristic impedance to the device electrode parts 12 of the semiconductor device 10. The evaluation boards 32 are fastened to the base 31 with fasteners 36 such as a plurality of screws. Two projected portions 35 are formed at both ends (outer peripheral sides of the base 31) of a gap between the two evaluation boards 32 on the base 31. In FIG. 1, an example is shown in which two of the projected portions 35 are arranged so as to sandwich the two flange portions 14 in the base member 11 of the semiconductor device 10. A device placement portion 37 for placing the semiconductor device 10 is formed in the center portion of the base 31. The device placement portion 37 corresponds to a region surrounded by the two evaluation boards 32 and the two projected portions 35. The projected portions 35 are intended to facilitate the positioning of the semiconductor device when the semiconductor device 10 is to be placed on the base 31, and to improve the positioning accuracy when the semiconductor device 10 is to be fixed to the evaluation table 30 by applying pressing force. In the device placement portion 37 of the base 31, insertion holes 34 are formed through which flange insertion parts 44 (refer to FIG. 3) of the flange pressing parts 23 in the device pressing member 20 that press the semiconductor device 10 are inserted.

The device pressing member 20 of the electrical characteristic measuring device 70 includes a supporting part 21, electrode pressing parts 22, and the flange pressing parts 23. The electrode pressing parts 22 make the connection by pressing the device electrode parts 12 of the semiconductor device 10 against the strip conductors 33 being conductive of the evaluation boards 32. The electrode pressing parts 22 are non-conductors, namely, insulating parts connected to the supporting part 21. The flange pressing parts 23 press connecting portions 18 (refer to FIG. 5) in the flange portions 14 of the base member 11 to fix the semiconductor device 10 at the device placement portion 37 of the base 31. When the semiconductor device 10 is pressed by the flange pressing parts 23, the backside of the base member 11 is connected to the device placement portion 37 of the base 31. The electrode pressing parts 22 and the flange pressing parts 23 are fixed to the supporting part 21, and the supporting part 21 is connected to an external pressing member 60. The external pressing member 60 is connected to a pressing force applying device that applies a pressing force.

As shown in FIG. 3, the flange pressing part 23 includes a connecting part 40, a flange contact part 42, and the flange insertion part 44. The flange insertion part 44 is fixed to the flange contact part 42 on the side of the semiconductor device 10, and the connecting part 40 is fixed to the flange contact part 42 on the opposite side to the semiconductor device 10. The connecting part 40 is a non-conductor, namely, insulating part that is connected to the supporting part 21. The flange contact part 42 and the flange insertion part 44 are conductive parts corresponding to the screw used to fasten the semiconductor device 10 to the mounting target apparatus. The flange contact part 42 is a member (screw head equivalent member) corresponding to the screw head of the screw 16 that is recommended (recommended screw) when the semiconductor device 10 to be evaluated is to be fastened with screws. The flange insertion part 44 is a member between the dashed line 45a and the dashed line 45b, and is a member (screw shaft equivalent member) corresponding to a shaft on which threads of the screw 16 are formed, the screw being recommended when the semiconductor device 10 to be evaluated is to be fastened with screws. In the flange contact part 42, the flange facing surface facing the flange portion 14 of the base member 11 has the same shape as a flange facing surface in the screw head of the screw 16 recommended when the semiconductor device 10 is to be fastened to the mounting target apparatus to which the semiconductor device is to be mounted. Note that, regarding the same shape in the flange facing surface of the flange contact part 42, an error or an acceptable margin in manufacturing is included. Further, the flange insertion part 44 is not threaded.

As shown in FIG. 5, when the semiconductor device 10 is to be fixed to the electrical characteristic measuring device 70, the flange insertion part 44 of the flange pressing part 23 is inserted into the screw insertion groove 15 provided in the flange portion 14 of the base member 11, and the connecting portion 18 that is a contacting and facing portion of the flange portion 14 facing the flange contact part 42 of the flange pressing part 23 is pressed by the flange contact part 42. When the semiconductor device 10 is to be fixed to the electrical characteristic measuring device 70, the connecting portion 18 of the base member 11 is pressed by the flange pressing part 23, so that the flange pressing part 23 is connected to the base member 11. In FIG. 5, the flange contact part 42 is indicated as a dashed line, and the portion where the base member 11 overlaps with the flange contact part 42 indicated as the dashed line is the connecting portion 18. This connecting portion 18 corresponds to the fastening portion 17 shown in FIG. 4. Accordingly, when the semiconductor device 10 is pressed against the evaluation table 30 by the device pressing member 20, the flange pressing part 23 is placed at a position in the base member 11 (at a position of the connecting portion 18) corresponding to a position of the fastening portion 17 in which the screw insertion groove 15 is included and in which the screw 16 is to be fastened to the base member 11. The flange pressing part 23 is placed at each of two positions of the connecting portions 18 of the base member 11.

The operation of the electrical characteristic measuring device 70 will be described. The semiconductor device 10 is placed in the device placement portion 37 of the evaluation table 30 (device placement procedure). As shown in FIG. 6, the device pressing member 20 is moved through the external pressing member 60 by a pressing force applying device (not shown) (pressing member movement procedure). The electrode pressing parts 22 press the device electrode parts 12 of the semiconductor device 10 with a set pressing force P1, and the flange contact parts 42 of the flange pressing parts 23 press the flange portions 14 of the base member 11 in the semiconductor device 10 with a set pressing force P2, and then the semiconductor device 10 is connected and fixed to the electrical characteristic measuring apparatus 70 by the device pressing member 20 (device connecting procedure). The pressing force P1 is a pressing force with which the device electrode parts 12 of the semiconductor device 10 are connected to the strip conductors 33 of the electrical characteristic measuring device 70 with a low resistance. The pressing force P2 is a pressing force with which the backside of the base member 11 of the semiconductor device 10 (the surface facing the base 31) is connected to the surface of the base 31 of the electrical characteristic measuring device 70 (the surface facing the base member 11) with a low resistance. For example, the pressing force P1 is a pressing force with which the resistance between the device electrode parts 12 and the strip conductors 33 are several Ω or less, and the pressing force P2 is a pressing force with which the resistance between the backside of the base member 11 and the front side of the base 31 is several Ω or less.

In FIG. 6, the external pressing member 60 including the supporting part 61 and the pressing rod 62 is shown. The supporting part 61 supports the pressing rod 62 and transmits the pressing force from the pressing force applying device to the device pressing member 20 of the electrical characteristic measuring device 70 via the pressing rod 62.

In the electrical characteristic measuring device 70 of Embodiment 1, the semiconductor device 10 can be connected to the electrical characteristic measuring device 70 by applying an appropriate pressing force to the connecting portions 18 corresponding to the fastening portions 17 when the semiconductor device 10 is to be fixed to the mounting target apparatus. In the electrical characteristic measuring device 70 of Embodiment 1, the semiconductor device 10 and the electrical characteristic measuring device 70 can be connected not with a lack of a pressing force but with a sufficient pressing force. Thus, it is possible to avoid the degradation of the heat dissipation and the accompanying degradation of the electrical characteristics in the semiconductor device that occur when the pressing force is insufficient.

Since the electrical characteristic measuring device of Patent Document 1 presses the top surface of the semiconductor device and the leads corresponding to the device electrode parts, the semiconductor sealed body is deformed or damaged when the pressing force equivalent to that in the screw fastening of the semiconductor device to the mounting target apparatus is applied. For the reason described above, it is necessary to connect the semiconductor device with a reduced pressing force. In contrast, in the electrical characteristic measuring device 70 of Embodiment 1, the semiconductor device 10 and the electrical characteristic measuring device 70 can be connected with the pressing force equivalent to that in the screw fastening with the screws 16, namely, not with a lack of a pressing force but with a sufficient pressing force. Note that, when a permissible margin for the same pressing force P as that in the screw fastening is ΔP, the pressing force equivalent to that in the screw fastening is in the range of P−ΔP to P+ΔP.

In the electrical characteristic measuring device 70 of Embodiment 1, the semiconductor device 10 is connected to the electrical characteristic measuring device 70 by pressing the flange portions 14 of the base member 11 using the flange pressing parts 23 having the flange contact parts 42 corresponding to the screw heads of the screws 16 recommended when the semiconductor device 10 is to be fastened to the mounting target apparatus with screws, so that the semiconductor device 10 can be connected to the electrical characteristic measuring device 70 with the same pressing force and pressing force distribution as the screw fastening with the screws 16. In the electrical characteristic measuring device 70 of Embodiment 1, the semiconductor device 10 and the electrical characteristic measuring device 70 can be connected with the distribution of the pressing force equivalent to the screw fastening with actual screws 16, and not with a lack of a pressing force but with a sufficient pressing force. Thus, it is possible to avoid the degradation of the heat dissipation and the accompanying degradation of the electrical characteristics in the semiconductor device that occur when the pressing force is insufficient. Note that the pressing force distribution equivalent to that of the screw fastening is a pressing force distribution generated by the pressing force equivalent to that of the screw fastening (pressing force in the range of P−ΔP to P+ΔP).

In the electrical characteristic measuring device of Patent Document 2, the entire longitudinal ends and the leads corresponding to the device electrode parts in the base member of the semiconductor device are pressed down. Therefore, it is necessary that the semiconductor device needs to be connected by lowering the pressing force in order to avoid deformation and destruction of the semiconductor device caused by a distribution of pressing force being applied to the semiconductor device different from the distribution of pressing force being applied to the semiconductor device by the screw fastening with the screws 16 when the semiconductor device is to be fixed to the mounting target apparatus. In contrast, in the electrical characteristic measuring device 70 of Embodiment 1, the semiconductor device 10 can be connected to the electrical characteristic measuring device 70 with the pressing force equivalent to those of the screw fastening with the screws 16 and with the distribution of the pressing force equivalent to those of the screw fastening with the screws 16, namely, not with a lack of a pressing force but with a sufficient pressing force.

Figure 7:
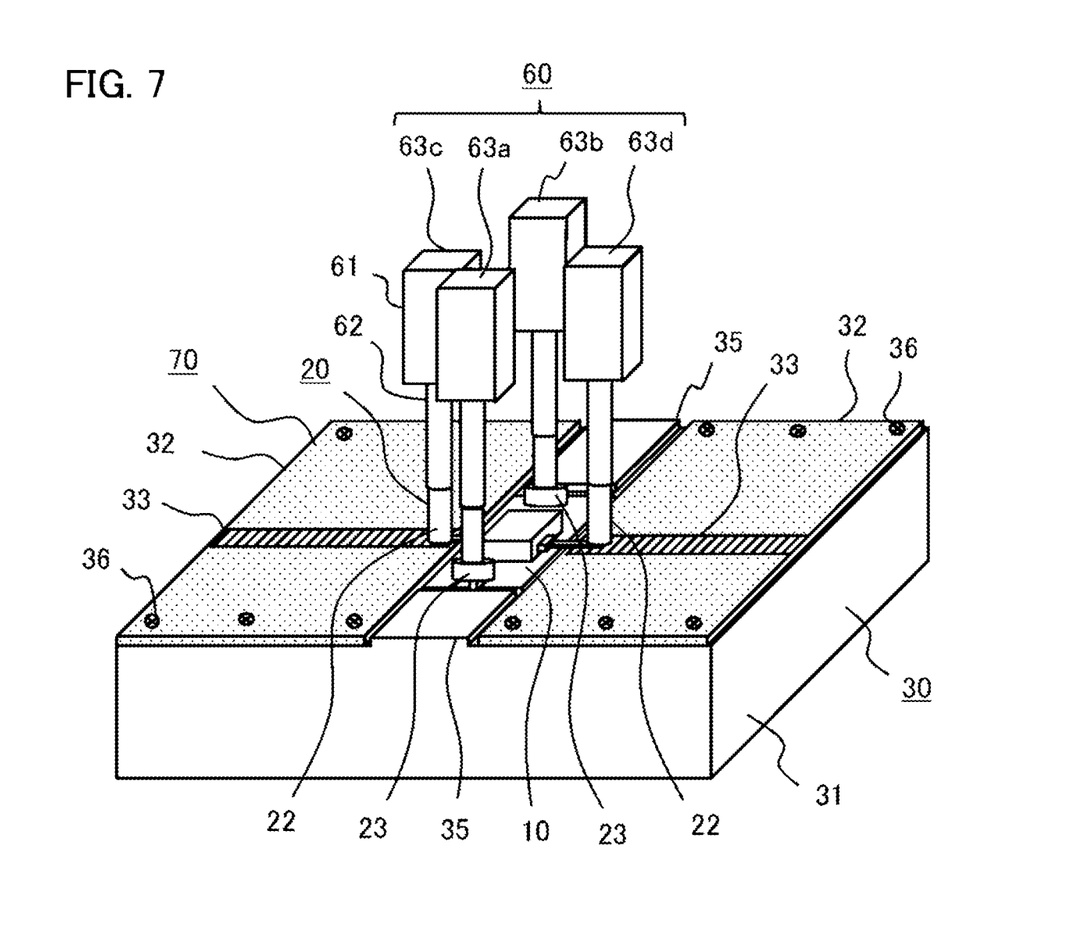
FIG. 7 is a perspective view of a second electrical characteristic measuring device and a second external pressing member according to Embodiment 1.
Figure 8:
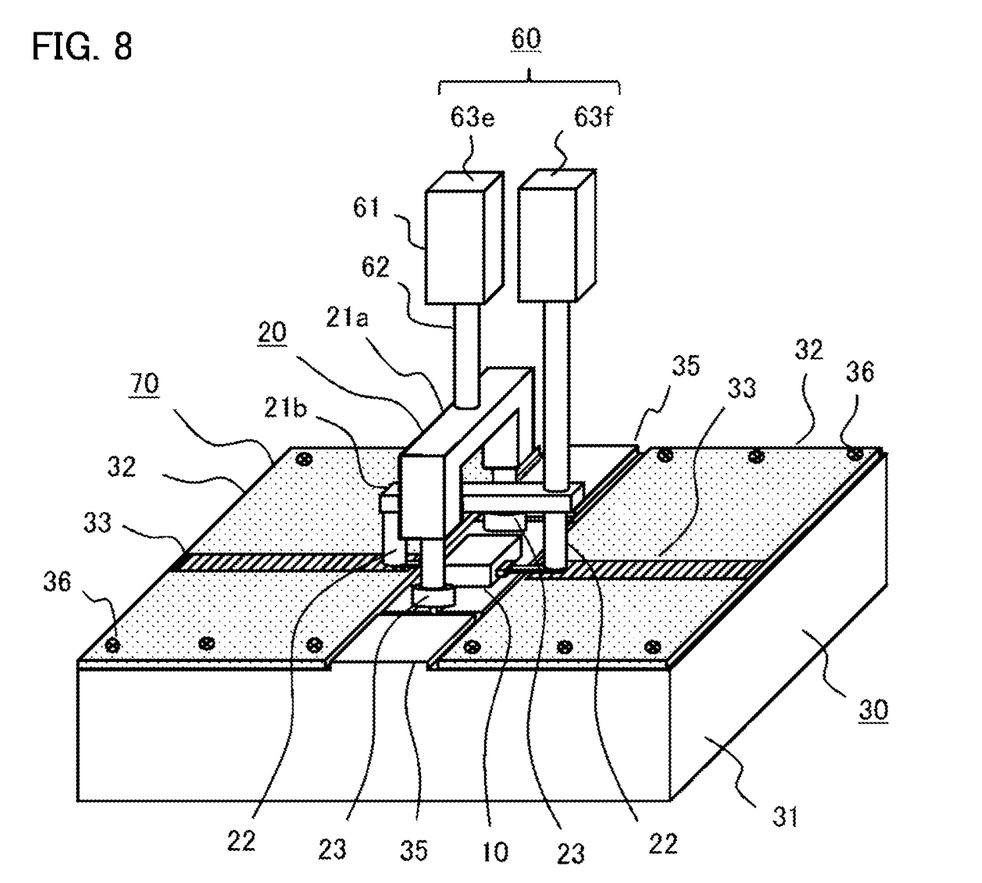
FIG. 8 is a perspective view of a third electrical characteristic measuring device and a third external pressing member according to Embodiment 1.

Note that in FIGS. 1 and 6, an example is shown in which the supporting part 21 is provided in the device pressing member 20, and the electrode pressing parts 22 and the flange pressing parts 23 are pressed simultaneously by the single external pressing member 60. However, this is not a limitation and other device pressing members 20 may also be used. FIG. 7 is a perspective view of a second electrical characteristic measuring device and a second external pressing member according to Embodiment 1, and FIG. 8 is a perspective view of a third electrical characteristic measuring device and a third external pressing member according to Embodiment 1. The device pressing member 20 of the second electrical characteristic measuring device 70 shown in FIG. 7 is an example in which two electrode pressing parts 22 and two flange pressing parts 23 without the supporting part 21 are configured. In the second electrical characteristic measuring device 70, the two electrode pressing parts 22 and the two flange pressing parts 23 are pressed by an external pressing member 60 having four independent pressing parts 63a, 63b, 63c, and 63d. The two flange pressing parts 23 are pressed by the pressing parts 63a and 63b, and the two electrode pressing parts 22 are pressed by the pressing parts 63c and 63d. Each of the pressing parts 63a, 63b, 63c, and 63d has the supporting part 61 and the pressing rod 62.

The device pressing member 20 of the third electrical characteristic measuring device 70 shown in FIG. 8 includes a supporting part 21a to support the two flange pressing parts 23 and a supporting part 21b to support the two electrode pressing parts 22. The two flange pressing parts 23 are fixed to the supporting part 21a, and the two electrode pressing parts 22 are fixed to the supporting part 21b. In the third electrical characteristic measuring device 70, the two electrode pressing parts 22 and the two flange pressing parts 23 are pressed by an external pressing member 60 having two independent pressing parts 63e and 63f. The supporting part 21a and the two flange pressing parts 23 are pressed by the pressing part 63e, and the supporting part 21b and the two electrode pressing parts 22 are pressed by the pressing part 63f. Each of the pressing parts 63e and 63f has the supporting part 61 and the pressing rod 62. In the device pressing member 20 in the third electrical characteristic measuring device 70, the supporting part 21a and the two flange pressing parts 23 are pressed by the pressing part 63e, so that the two flange pressing parts 23 can be pressed evenly. Further, in the device pressing member 20 in the third electrical characteristic measuring device 70, the supporting part 21b and the two electrode pressing parts 22 are pressed by the pressing part 63f, so that the two electrode pressing parts 22 can be pressed evenly.

As described above, the electrical characteristic measuring device 70 of Embodiment 1 is an electrical characteristic measuring device for the semiconductor device used when measuring electrical characteristics of the semiconductor device 10 including the base member 11 in which a plurality of the screw insertion grooves 15 are formed, and comprises the evaluation table 30 in which the semiconductor device 10 is to be placed and the device pressing member 20 to press the semiconductor device 10 against the evaluation table 30. The evaluation table 30 comprises the conductive base 31 in which the semiconductor device 10 is to be placed and also the device placement portion 37 is formed to connect the base member 11 of the semiconductor device 10, and comprises a plurality of the evaluation boards 32 in which the strip conductors 33 each to be connected to each of a plurality of the device electrode parts 12 of the semiconductor device 10 is formed. The device pressing member 20 comprises the non-conductive electrode pressing parts 22 each to press each of the plurality of device electrode parts 12 of the semiconductor device 10 against each of the strip conductors 33 of the evaluation table 30, and comprises a plurality of the flange pressing parts 23 in which the conductive flange insertion parts 44 each to be inserted into each of the plurality of screw insertion grooves 15 formed in flange portions 14 that are the ends of the base member 11, and the conductive flange contact parts 42 fixed to the flange insertion parts 44, to press the flange portions 14 of the base member 11 against the base 31. In the flange contact parts 42, the flange facing surfaces facing the flange portion 14 of the base member 11 have the same shape as flange facing surfaces of the screw heads of the recommended screws (screws 16) recommended when the semiconductor device 10 is to be fastened to the mounting target apparatus in which the semiconductor device is to be mounted. In the electrical characteristic measuring device 70 of Embodiment 1, when the semiconductor device 10 is to be pressed against the evaluation table 30 by the device pressing member 20, each of the flange pressing parts 23 is placed at each of the positions (the positions of the connecting portions 18) in the flange portions 14 of the base member 11 corresponding to each of the positions of the fastening portions 17 in which the screw insertion grooves 15 are included and in which the recommended screws (screws 16) are to be fastened to the flange portions 14 of the base member 11, and each of the electrode pressing parts 22 is placed at each of the device electrode parts 12. With the configuration of the electrical characteristic measuring device 70 of Embodiment 1, the flange facing surfaces of the flange pressing parts 23 have the same shape as the flange facing surfaces in the screw heads of the recommended screws (screws 16), and the flange pressing parts 23 are placed at the positions (the positions of the connecting portions 18) corresponding to the positions of the fastening portions 17 in which the recommended screws (screws 16) are fastened to the flange portions 14 of the base member 11, and thus the pressing force can be increased more than in the past when electrical characteristics are measured.

Embodiment 2

Figure 9:
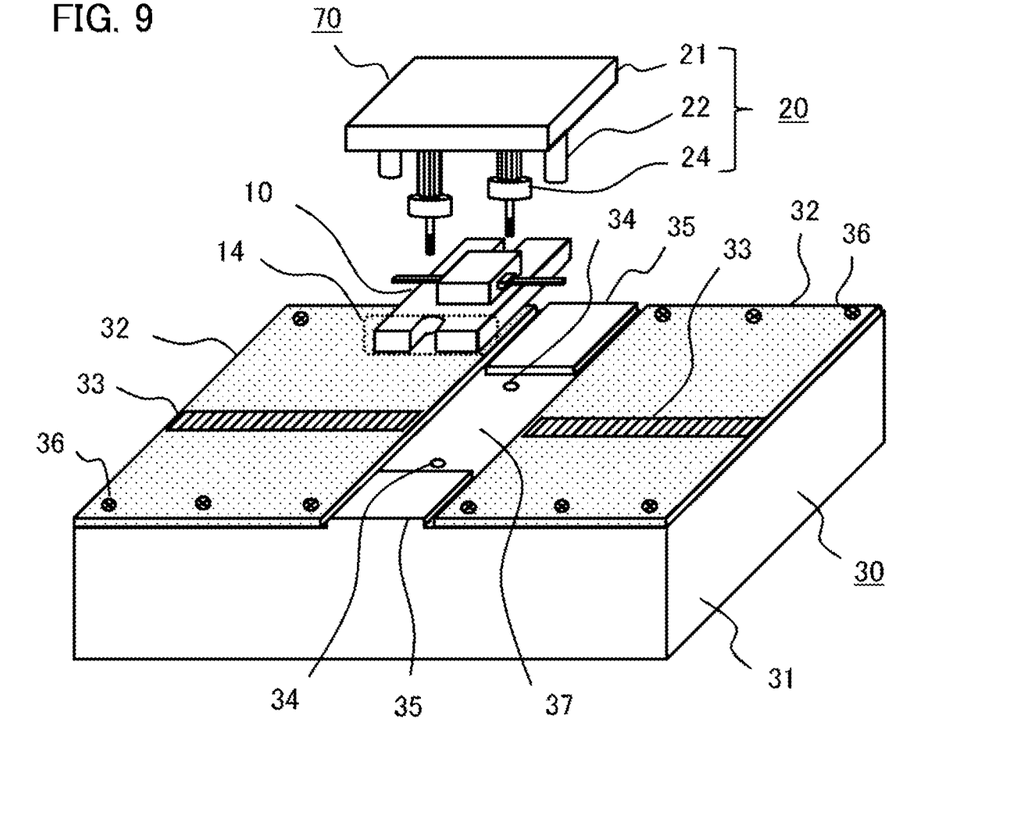
FIG. 9 is a perspective view of an electrical characteristic measuring device according to Embodiment 2.
Figure 10:
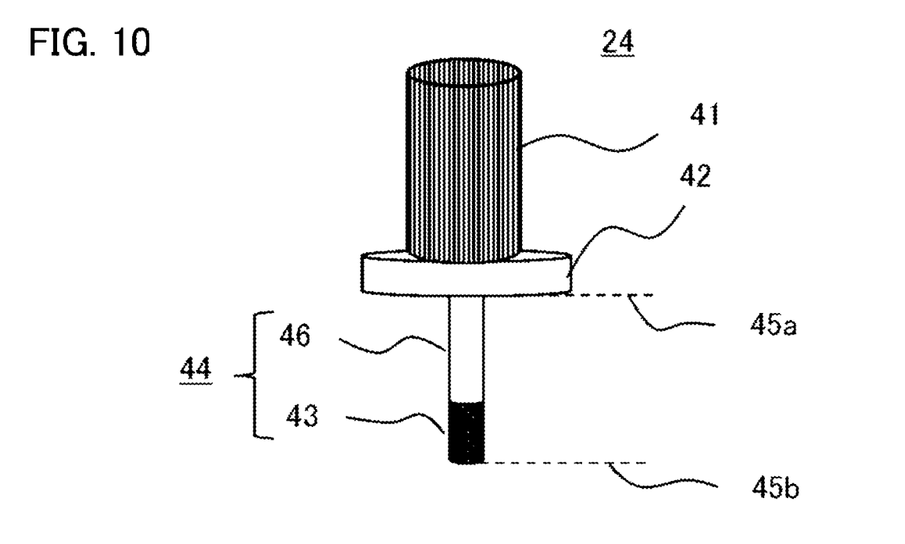
FIG. 10 is a diagram illustrating a flange pressing part of FIG. 9.

FIG. 9 is a perspective view of an electrical characteristic measuring device according to Embodiment 2, and FIG. 10 is a diagram illustrating a flange pressing part of FIG. 9. The electrical characteristic measuring device 70 of Embodiment 2 differs from the electrical characteristic measuring device 70 of Embodiment 1 in that the device pressing member 20 includes a flange pressing part 24. The flange pressing portion 23 in the electrical characteristic measuring device 70 of Embodiment 1 includes the connecting part 40, the flange contact part 42, and the flange insertion part 44. The connecting part 40 of the flange pressing part 24 in the electrical characteristic measuring device 70 according to Embodiment 2 is a non-conductor, namely, insulating part that is connected to the supporting part 21. The flange contact part 42 in the electrical characteristic measuring device 70 of Embodiment 2 is the same as the flange contact part 42 of the flange pressing part 23. The flange insertion part 44 of the flange pressing part 24 in the electrical characteristic measuring device 70 of Embodiment 2 differs from the flange insertion part 44 of Embodiment 1 in that the flange insertion part has a conductive elastic body 43 at the tip and a conductive axial base 46. The axial base 46 is fixed to the flange contact part 42, and the elastic body 43 is disposed at the tip in the extending direction of the axial base 46. In the flange pressing part 24 of Embodiment 2, the flange contact part 42 and the axial base 46 of the flange insertion part 44 are conductive parts.

In the device connecting procedure of the electrical characteristic measuring device 70 of Embodiment 2, the flange pressing part 24 transmits the pressing force from the pressing force applying device to the flange contact part 42 via the connecting part 41, and the connecting portion 18 of the base member 11 in the semiconductor device 10 is pressed by the flange contact part 42 to connect the semiconductor device 10 to the base 31 of the electrical characteristic measuring device 70. At this time, the elastic body 43 is pushed down so as to fit in the insertion hole 34. When the conductive elastic body 43 hits the bottom surface of the insertion hole 34, the elastic body 43 is deformed by the pressing force by which the device pressing member 20 is pressed, and presses the inner side surface of the insertion hole 34. That is, the elastic body is deformed so as to be in contact with the inner side surface of the insertion hole 34, so that the elastic body 43 corresponding to the screw can obtain good connectivity with the base 31.

In the case where a conductive screw (e.g., special use stainless steel (SUS) screw) is used to fix the semiconductor device 10 to the target mounting apparatus, the base member 11 and the mounting portion of the mounting target apparatus (corresponding to the device placement portion 37 of the evaluation table 30) are electrically connected owing to the connection between the backside of the base member 11 and the front side (flange facing surface) of the mounting portion of the mounting target apparatus, and the connection between the front side of the base member 11 and the screw hole of the mounting portion via the screw. When the connection method according to Patent Documents 1 and 2 is executed, the electrical connection between the base member 11 and the mounting portion of the mounting target apparatus is made only on the backside of the base member 11 and the front side of the mounting portion of the mounting target apparatus, and is different from the electrical connection at the time of the fastening with screws.

In contrast, in the electrical characteristic measuring device 70 of Embodiment 2, the same electrical connection can be made between the semiconductor device 10 and the base 31 of the evaluation table 30 as in the case of the screw fastening. Further, since the electrical characteristic measuring device 70 of Embodiment 2 includes the flange pressing part 24 provided with the conductive elastic body 43, good contact and conductivity between the base 31 of the evaluation table 30 and the elastic body 43 can be securely obtained.

The electrical characteristic measuring device 70 of Embodiment 2 has the same advantageous effects as those of the electrical characteristic measuring device 70 of Embodiment 1 in addition to the advantageous effect of the elastic body 43 of the flange pressing part 24 described above. The electrical characteristic measuring device 70 of Embodiment 2 can increase the pressing force more than in the past when measuring the electrical characteristics as with the electrical characteristic measuring device 70 of Embodiment 1. In the electrical characteristic measuring device 70 of Embodiment 2, the semiconductor device 10 and the electrical characteristic measuring device 70 can be connected not with a lack of a pressing force but with a sufficient pressing force. Thus, it is possible to avoid the degradation of the heat dissipation and the accompanying degradation of the electrical characteristics in the semiconductor device that occur when the pressing force is insufficient. In the electrical characteristic measuring device 70 of Embodiment 2, the semiconductor device 10 and the electrical characteristic measuring device 70 can be connected with the distribution of the pressing force equivalent to the screw fastening with the actual screw 16, and also not with a lack of a pressing force but with a sufficient pressing force. Thus, it is possible to avoid the degradation of the heat dissipation and the accompanying degradation of the electrical characteristics in the semiconductor device that occur when the pressing force is insufficient.

Embodiment 3

Figure 11:
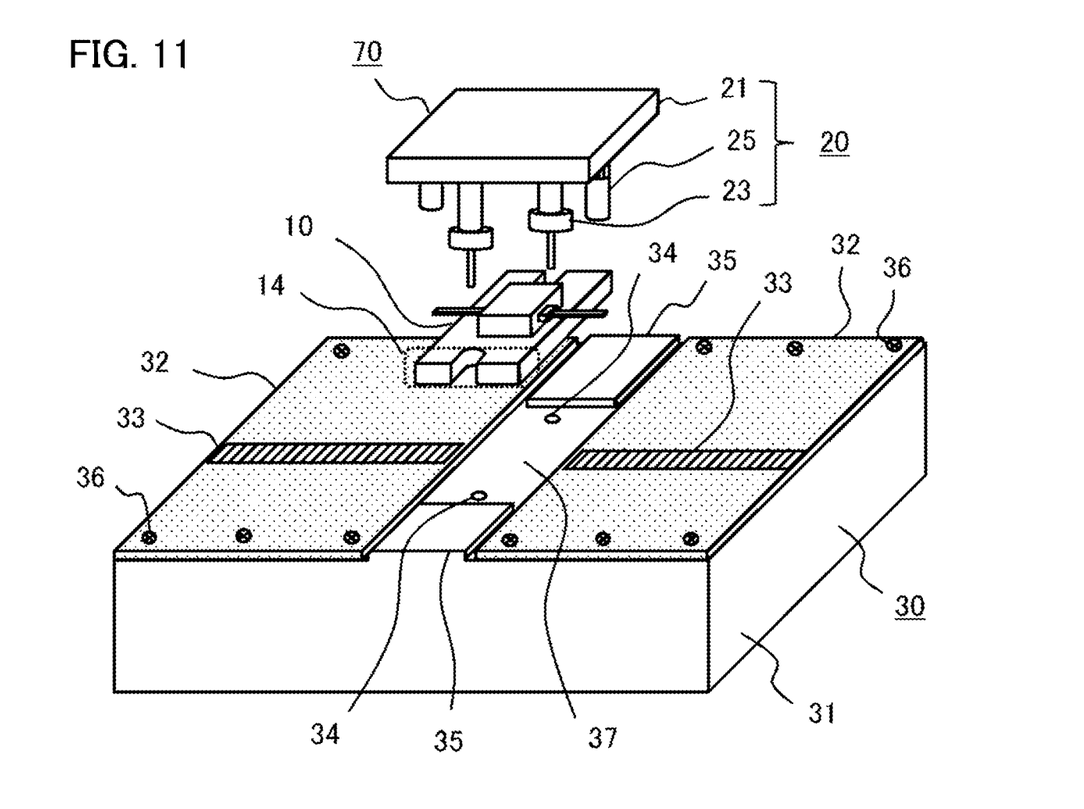
FIG. 11 is a perspective view of an electrical characteristic measuring device according to Embodiment 3.
Figure 12:
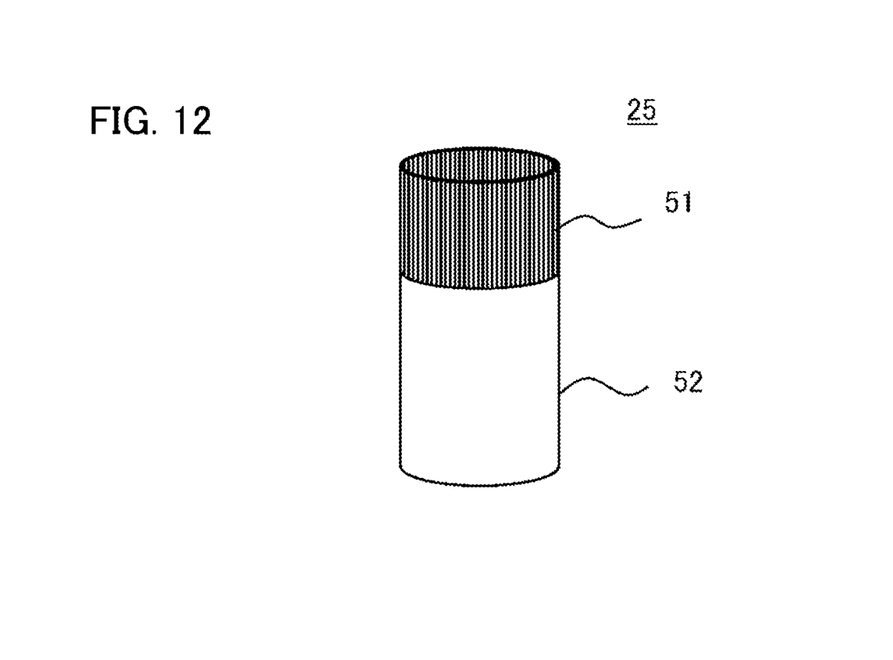
FIG. 12 is a diagram illustrating an electrode pressing part of FIG. 11.

FIG. 11 is a perspective view of an electrical characteristic measuring device according to Embodiment 3, and FIG. 12 is a diagram illustrating an electrode pressing part of FIG. 11. The electrical characteristic measuring device 70 of Embodiment 3 differs from the electrical characteristic measuring device 70 of Embodiment 1 in that the device pressing member 20 includes an electrode pressing part 25. The electrode pressing part 22 in the electrical characteristic measuring device 70 of Embodiment 1 is a part of a non-conductor (insulator) that is connected to the supporting part 21. The electrode pressing part 25 of the electrical characteristic measuring device 70 of Embodiment 3 is different from the electrode pressing part 22 of the electrical characteristic measuring device 70 of Embodiment 1 in that the electrode pressing part includes a connecting part 51 of a non-conductive part, namely, insulating part, connected to the supporting part 21, and an electrode contact part 52 is elastic and a non-conductor. The connecting part 51 is a part for transmitting the pressing force from the supporting part 21 to the electrode contact part 52, and is a non-conductive part less elastic than the electrode contact part 52. The electrode contact part 52 has elasticity suitable for pressing the device electrode part 12.

In the device connecting procedure of the electrical characteristic measuring device 70 of Embodiment 3, the pressing force from the pressing force applying device is transmitted to the electrode contact part 52 via the connecting part 51, and the device electrode part 12 of the semiconductor device 10 is pressed by the electrode contact part 52, so that the device electrode part 12 is connected to the strip conductor 33 of the evaluation board 32 in the electrical characteristic measuring device 70.

In the case of the semiconductor device 10 for which the screw fastening is to be performed, there is a difference between the appropriate pressing force for fixing the base member 11 to the mounting target apparatus and the necessarily pressing force, namely, the appropriate pressing force required for connecting the device electrode 12. As shown in FIG. 6 of Embodiment 1, when one external pressing member 60 is used for the device pressing member 20, it is necessary to accurately adjust the height of the electrode pressing part 22 in order to optimize the pressing force against the device electrode part 12 by the electrode pressing part 22 so as not to be excessive. When it is difficult to optimize the pressing force from the device pressing member 20 transmitted to the device electrode part 12, for example, even when there exists only one external pressing member 60 and the height of the electrode pressing part 22 is not accurately adjusted, the electrical characteristic measuring device 70 of Embodiment 3 can press the device electrode part 12 by the electrode contact part 52 having appropriate elasticity. As a result, the electrical characteristic measuring device 70 of Embodiment 3 can avoid an excessive pressing force on the device electrode part 12 while maintaining good contact between the device electrode part 12 and the strip conductor 33. That is, the device electrode part 12 can be pressed with an appropriate pressing force, so that scratches and deformation of the device electrode part 12 can be avoided. Accordingly, since the electrical characteristic measuring device 70 of Embodiment 3 is equipped with the device pressing member 20 comprising the electrode pressing part 25 including the electrode contact part 52 and the connecting part 51, without accurately adjusting the height of the electrode pressing part 22, the device electrode part 12 can be pressed with an appropriate pressing force, so that scratches and deformation of the device electrode part 12 can be avoided.

The electrical characteristic measuring device 70 of Embodiment 3 has the same advantageous effects as those of the electrical characteristic measuring device 70 of Embodiment 1 in addition to the advantageous effect of the electrode contact part 52 of the electrode pressing part 25 described above. The electrical characteristic measuring device 70 of Embodiment 3 can increase the pressing force more than in the past when measuring the electrical characteristics as with the electrical characteristic measuring device 70 of Embodiment 1. In the electrical characteristic measuring device 70 of Embodiment 3, the semiconductor device 10 and the electrical characteristic measuring device 70 can be connected not with a lack of a pressing force but with a sufficient pressing force. Thus, it is possible to avoid the degradation of the heat dissipation and the accompanying degradation of the electrical characteristics in the semiconductor device that occur when the pressing force is insufficient. In the electrical characteristic measuring device 70 of Embodiment 3, the semiconductor device 10 and the electrical characteristic measuring device 70 can be connected with the distribution of the pressing force equivalent to the screw fastening with the actual screw 16, and also not with a lack of a pressing force but with a sufficient pressing force. Thus, it is possible to avoid the degradation of the heat dissipation and the accompanying degradation of the electrical characteristics in the semiconductor device that occur when the pressing force is insufficient.

Note that, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

10: semiconductor device, 11: base member, 12: device electrode part, 14: flange portion, 15: screw insertion groove, 16: screw (recommended screw), 17: fastening portion, 18: connecting portion, 20: device pressing member, 21, 21a, 21b: supporting part, 22: electrode pressing part, 23: flange pressing part, 24: flange pressing part, 25: electrode pressing part, 30: evaluation table, 31: base 32: evaluation board, 33: strip conductor, 34: insertion hole, 35: projected portion, 37: device placement portion, 42: flange contact part, 43: elastic body, 44: flange insertion part, 46: axial base, 52: electrode contact part, 70: electrical characteristic measuring device

The invention claimed is:

1. An electrical characteristic measuring device for a semiconductor device used when measuring electrical characteristics of the semiconductor device including a base member in which a plurality of screw insertion grooves are formed, the electrical characteristic measuring device comprising: an evaluation table in which the semiconductor device is to be placed; and a device pressing member to press the semiconductor device against the evaluation table, wherein the evaluation table comprises a conductive base in which the semiconductor device is to be placed and also a device placement portion to be connected to the base member of the semiconductor device is formed, and a plurality of evaluation boards in which strip conductors each to be connected to each of a plurality of device electrode parts of the semiconductor device is formed; the device pressing member comprises a plurality of non-conductive electrode pressing parts each to press each of the plurality of device electrode parts of the semiconductor device against each of the strip conductors of the evaluation table, and comprises a plurality of flange pressing parts in which conductive flange insertion parts each to be inserted into each of the plurality of screw insertion grooves formed in flange portions that are ends of the base member, and conductive flange contact parts fixed to the flange insertion parts, to press the flange portions of the base member against the base; and the flange contact parts are such that flange facing surfaces thereof facing the flange portion of the base member have the same shape as flange facing surfaces of screw heads of screws when the semiconductor device is to be fastened to a mounting target apparatus in which the semiconductor device is to be mounted, and when the semiconductor device is to be pressed against the evaluation table by the device pressing member, each of the flange pressing parts is placed at each of positions in the flange portions of the base member corresponding to each of positions of fastening portions in which the screw insertion grooves are included and in which the screws are to be fastened to the flange portions of the base member, and each of the electrode pressing parts is placed at each of the device electrode parts.

2. The electrical characteristic measuring device for the semiconductor device according to claim 1, wherein the device pressing member further comprises a supporting part in which the plurality of electrode pressing parts and the plurality of flange pressing parts are fixed.

3. The electrical characteristic measuring device for the semiconductor device according to claim 1, wherein the device pressing member further comprises a first supporting part to which the plurality of electrode pressing parts are fixed and a second supporting part to which the plurality of flange pressing parts are fixed.

4. The electrical characteristic measuring device for the semiconductor device according to claim 1,
wherein the flange insertion parts of the flange pressing parts each comprise an axial base fixed to each of the flange contact parts and a conductive elastic body disposed at a tip in an extending direction of the axial base;
in the evaluation table, an insertion hole to which the elastic body in the flange insertion parts of the flange pressing parts is to be inserted is formed in the device placement portion; and
when the semiconductor device is to be pressed against the evaluation board by the device pressing member, the elastic body is deformed by a pressing force that presses the device pressing member in such a way that the elastic body comes in contact with an inner side surface of the insertion hole.

5. The electrical characteristic measuring device for the semiconductor device according to claim 1, wherein the electrode pressing parts each comprise a non-conductive electrode contact part having elasticity on a side of the semiconductor device.

6. The electrical characteristic measuring device for the semiconductor device according to claim 1, wherein, in the evaluation table, a plurality of projected portions that are arranged so as to sandwich the base member of the semiconductor device are formed in a gap portion where side surfaces of the plurality of evaluation boards are arranged to face each other.

7. The electrical characteristic measuring device for the semiconductor device according to claim 2,
wherein the flange insertion parts of the flange pressing parts each comprise an axial base fixed to each of the flange contact parts and a conductive elastic body disposed at a tip in an extending direction of the axial base;
in the evaluation table, an insertion hole to which the elastic body in the flange insertion parts of the flange pressing parts is to be inserted is formed in the device placement portion; and
when the semiconductor device is to be pressed against the evaluation board by the device pressing member, the elastic body is deformed by a pressing force that presses the device pressing member in such a way that the elastic body comes in contact with an inner side surface of the insertion hole.

8. The electrical characteristic measuring device for the semiconductor device according to claim 3,
wherein the flange insertion parts of the flange pressing parts each comprise an axial base fixed to each of the flange contact parts and a conductive elastic body disposed at a tip in an extending direction of the axial base;
in the evaluation table, an insertion hole to which the elastic body in the flange insertion parts of the flange pressing parts is to be inserted is formed in the device placement portion; and
when the semiconductor device is to be pressed against the evaluation board by the device pressing member, the elastic body is deformed by a pressing force that presses the device pressing member in such a way that the elastic body comes in contact with an inner side surface of the insertion hole.

9. The electrical characteristic measuring device for the semiconductor device according to claim 2, wherein the electrode pressing parts each comprise a non-conductive electrode contact part having elasticity on a side of the semiconductor device.

10. The electrical characteristic measuring device for the semiconductor device according to claim 3, wherein the electrode pressing parts each comprise a non-conductive electrode contact part having elasticity on a side of the semiconductor device.

11. The electrical characteristic measuring device for the semiconductor device according to claim 4, wherein the electrode pressing parts each comprise a non-conductive electrode contact part having elasticity on a side of the semiconductor device.

12. The electrical characteristic measuring device for the semiconductor device according to claim 2, wherein, in the evaluation table, a plurality of projected portions that are arranged so as to sandwich the base member of the semiconductor device are formed in a gap portion where side surfaces of the plurality of evaluation boards are arranged to face each other.

13. The electrical characteristic measuring device for the semiconductor device according to claim 3, wherein, in the evaluation table, a plurality of projected portions that are arranged so as to sandwich the base member of the semiconductor device are formed in a gap portion where side surfaces of the plurality of evaluation boards are arranged to face each other.

14. The electrical characteristic measuring device for the semiconductor device according to claim 4, wherein, in the evaluation table, a plurality of projected portions that are arranged so as to sandwich the base member of the semiconductor device are formed in a gap portion where side surfaces of the plurality of evaluation boards are arranged to face each other.

15. The electrical characteristic measuring device for the semiconductor device according to claim 5, wherein, in the evaluation table, a plurality of projected portions that are arranged so as to sandwich the base member of the semiconductor device are formed in a gap portion where side surfaces of the plurality of evaluation boards are arranged to face each other.

\* \* \* \* \*